United States Patent [19]

Licari et al.

[11] Patent Number: 5,002,818
[45] Date of Patent: Mar. 26, 1991

[54] REWORKABLE EPOXY DIE-ATTACH ADHESIVE

[75] Inventors: James J. Licari, Whitter; Gabriel G. Bakhit, Huntington Beach, both of Calif.

[73] Assignee: Hughes Aircraft Company, Los Angeles, Calif.

[21] Appl. No.: 408,864

[22] Filed: Sep. 5, 1989

[51] Int. Cl.$^5$ .............................................. B32B 9/00
[52] U.S. Cl. .................................... 428/209; 428/323; 428/413; 428/414; 428/901; 206/228; 206/230; 528/422; 525/530; 525/531
[58] Field of Search ................ 206/228, 230; 428/209, 428/901, 323, 413, 414; 528/422; 525/530, 531

[56] References Cited

PUBLICATIONS

Epoxy Resin—Phenoxy Resin Blend, CA 110(10):77051(s), 3M (Schenz).
Polyimide Compsns Die Attach Adhesives, Mat Chem, EP Abs 89309229, Powell et al.
High Temp Elec. Cond. Ads., Mactiner et al., Sampe Conf.
Thermoplastic Films for Adh Bonding, Shore, 39th Electronic Comps. Proceedings.

*Primary Examiner*—Patrick J. Ryan
*Attorney, Agent, or Firm*—Terje Gudmestad; Jeannette M. Walder; W. K. Denson-Low

[57] ABSTRACT

An adhesive mixture reworkably adheres electronic integrated circuit dies to hybrid microcircuit substrates, and includes a thermosetting epoxy resin. A thermoplastic resin additive allows the mixture to retain the high adhesive strength of the epoxy resin up to approximately 150° C., or the upper limit of the operating and testing temperature range of the dies, and then soften sufficiently to enable defective dies to be removed at a temperature of preferably between 150° C. and 200° C. without damage to the substrate or adjacent dies.

23 Claims, 1 Drawing Sheet

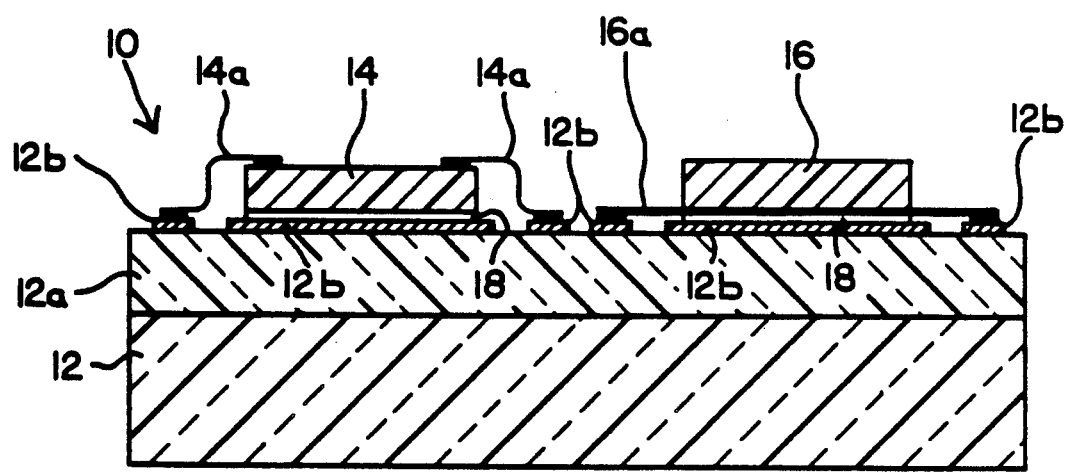

REWORKABLE EPOXY DIE-ATTACH ADHESIVE

BACKGROUND OF THE INVENTION

1. Field of the Invention

The present invention generally relates to the field of adhesives, and more particularly to an adhesive mixture which enables electronic integrated circuit dies to be strongly attached to hybrid microcircuit substrates, and subsequently removed if necessary at a low enough temperature so as not to damage the substrates or adjacent dies.

2. Description of the Related Art

Thermosetting epoxies are widely used as adhesives for electronic applications. They are noted for their high adhesive strength to a wide variety of surfaces and materials. Their adhesive strength derives mainly from their highly polar molecular structure, which results in H-bonding and Van der Waals forces of attraction to surfaces such as alumina, ceramic, silicon, other epoxies, and even gold. Epoxies are therefore widely used, for example, for integrated circuit die attachment in hybrid microcircuits, component attachment in printed wiring boards, heat sink attachment, and ceramic substrate attachment inside hermetically sealed packages. Epoxy resins are generally of the diglycidyl ether of bisphenol A (DGEBA) types cured with a variety of catalysts or hardeners as is well known in the art. The reworking of components, once bonded with epoxy, has always presented a problem, and no ideal method has been heretofore discovered. Generally, heat and pressure are applied simultaneously to the device to be removed. When the epoxy reaches its glass transition temperature $T_G$, which is usually 200° C. or higher, it softens, at which point a laterally applied force effects its detachment. The entire circuit often must be subjected to high temperature (200° C. or higher), which risks damaging wire bonds or other temperature-sensitive elements of the circuit. Nevertheless, with the use of small die (less than 100 mils square) and moderately spaced die (greater than 200 mils chip-to-chip), epoxy-attached devices have been able to be reworked.

With the emergence of a new generation of very high density circuits, also referred to as hybrid wafer scale integration, or multichip module, the combination of high strength and reworkability becomes a critical issue. These new circuits utilize VLSIC (Very Large Scale Integrated circuits), VHSIC (Very High Speed Integrated Circuit), MIMIC (Millimeter Microwave Integrated Circuit), and other high-density dies that are approaching one inch square and are closely packed (less than 70 mils chip-to-chip) for high-speed applications. These large devices are also being assembled onto thin film multilayer interconnect substrates that have polyimide or another low-dielectric constant polymer as part of their structure.

Die-attach adhesives which meet all current standards and must also be removable will be needed for hybrid circuits where gate-arrays of approximately 600 mils square and chip-to-chip spacings of 70 mils are requirements. Other digital and analog circuits that will be fabricated using the HDMI (high density multichip interconnect substrate), also known as Hybrid Wafer Scale Integration, process will also require these adhesives.

Three problems arise in this environment.

1. The larger devices have a larger surface area, and therefore require greater force to remove.

2. The closer packed devices with small inter-chip spacings make the use of a heated tool to apply a shear force between devices difficult or impossible without damaging vicinal devices or wire bonds.

3. The extra force and temperature necessary to remove a die can damage the underlying organic dielectric, resulting in having to scrap a very expensive interconnect substrate.

Thermoplastic films and paste adhesives are also being investigated because they soften or melt. However, these suffer from two limitations for electronic applications.

1. Many of them must be dispensed from a solvent, and these solvents are difficult to completely remove, especially from underneath large area dies.

2. Most require very high temperatures (300° C. or higher) to melt or soften and, depending on the extent of rework, such temperatures can be damaging to wire bonds and some devices.

SUMMARY OF THE INVENTION

The present invention fills the above discussed need by providing an adhesive mixture which includes a thermosetting epoxy resin. A thermoplastic additive allows the mixture to retain the high adhesive strength of the epoxy resin up to approximately 150° C., or the upper limit of the operating and testing temperature range of the dies, and then rapidly soften to enable selected dies to be removed at a temperature of preferably between 150° C. and 200° C. without damage to the substrate or adjacent dies.

A reworkable electronic component structure, according to the invention, may comprise a substrate; an electronic circuit component; and an adhesive for reworkably adhering the components to the substrate, the adhesive including: a curable thermosetting resin; and an additive selective to cause the adhesive, in its cured state, to soften at a temperature between approximately 100° C. and 250° C. A reworkable, electronic, die-attach adhesive, according to the invention, may comprise a curable thermosetting resin; and an additive selected to cause the adhesive, in its cured state, to soften at a temperature between approximately 100° C. and 250° C.

The adhesive mixture may also include a filler to control shrinkage or expansion coefficients, enhance thermal conductivity, or render the adhesive electrically conductive.

The present invention further provides an electronic component structure including at least one electronic component, typically an integrated circuit die, which is reworkably adhered to a substrate by means of the present adhesive.

These and other features and advantages of the present invention will be apparent to those skilled in the art from the following detailed description, taken together with the accompanying drawing.

DESCRIPTION OF THE DRAWINGS

The single Figure of drawing is a fragmentary side view, partially in section, of an electronic component structure including a reworkable die-attach adhesive according to the present invention.

DETAILED DESCRIPTION OF THE INVENTION

Hybrid microcircuits include a number of component packages, or dies, which may be integrated circuits or discrete components, mounted on a substrate board. The present adhesive is especially intended for attaching dies to substrates in the microelectronic art, in an environment in which the circuit may have to be reworked. Such reworking would include removal of particular dies from the substrate which prove to be defective in testing or which are subject to upgrading by replacement with improved components. However, the present adhesive is directly applicable to any field of technology in which two materials are to be strongly bonded together, subject to possible separation at a later time for any intended purpose.

An electronic component structure embodying the present invention is illustrated in FIG. 1 and designated as 10. The structure 10 includes a hybrid microelectronic substrate 12 which has a conductive pad metallization layer 12b formed on top of a dielectric sheet 12a. Components 14 and 16, which may be microelectronic circuit dies which may be connected by wire bonding or tape automated bonding, are reworkably adhered to the substrate 12 by means of a reworkable, die-attach adhesive 18 of the invention. Although only two components 14 and 16 are shown in the drawing for illustrative purposes, a practical structure embodying the invention will include a large number of components which are closely spaced together.

The components 14 and 16 may range from discrete components such as power transistors or inductors, to integrated circuits with any desired high level of integration, and have leads 14a and 16a. The leads 14a and 16a are ohmically connected to respective portions of the interconnect layer 12b by means such as soldering thermocompression or thermosonic bonding, although not illustrated in detail. The interconnect layer 12b may alternatively be formed on the top of the dielectric sheet 12a, or have a multi-layer configuration within the scope of the invention.

The structure 10 is assembled by applying the adhesive 18 to either or both of the substrate 12 and components 14 and 16 in uncured form, pressing the components 14 and 16 onto the substrate 12 in proper alignment, and curing the adhesive 18 using an appropriate thermal or other curing mechanism. The structure 10 may be reworked by removing selected components 14 or 16. This is accomplished in one of two ways (a) by inserting a bladed tool heated to a temperature of 100° C. to 250° C. (depending on the adhesive's softening or melt temperature) between the selected component 14 or 16 and the substrate, and applying a shear force until the component detaches or (b) by applying heat selectively to the device, then removing it from the top of the device using a vacuum tool. The removal methods are given by way of illustration; other methods are possible. The leads 14a and 16a may be cut prior to component removal, or may be broken off as the component separates from the substrate.

The present adhesive 18 includes two main components which act in combination to enable strong adhesive bonding up to a desired temperature, and sufficient softening of the adhesive to effect separation of the bonded surfaces at a slightly higher temperature. The primary component of the present adhesive is a thermosetting resin. Current state-of-the art epoxy adhesives, although meeting all of the engineering requirements of current standards, are difficult to remove, and reworking of high density circuits cannot be accomplished. More particularly, conventional epoxy resins, including those which may be utilized as the thermosetting resin in the present adhesive, begin to soften at their glass transition temperature $T_G$, which is generally above 200° C. Even in the softened state of the adhesive, considerable mechanical force is required to remove a die from a substrate. Assembled electronic components usable in practical applications are generally designed to withstand processing and operating temperatures up to approximately 155° C. Heating of mounted dies to temperatures substantially in excess of 200° C. will cause damage.

In order to overcome this problem, the present adhesive includes an additive which is mixed with the thermosetting resin, and is selected such that the adhesive mixture, in its cured or hardened state, will soften sufficiently in a temperature range between approximately 150° C. and 200° C. to enable die removal with a small enough amount of mechanical force to avoid damage to the substrate or adjacent dies.

Although any thermosetting adhesive material may be utilized within the scope of the present invention, the preferred embodiment includes a thermosetting epoxy resin of the diglycidyl ether of bisphenol A (DGEBA) type. The epoxy resin may be supplied as a one-component type or a two-component type, and includes a curing agent (hardener, activator, or catalyst) for hardening or curing at room temperature with heat produced by exothermic reaction, or by the application of external heat or other radiation. The epoxy resin is selected such that the heat produced or applied during the curing process does not generate a temperature high enough to damage the microcircuit dies or substrate boards. Details of applicable epoxy resin systems are thoroughly covered in the available literature, for example in a textbook entitled "Handbook of Epoxy Resins", by H. Lee et al, McGraw-Hill, 1967. Thermosetting epoxy formulations based, for example, on Epon 828 or other diglycidyl ether or bisphenol A and hardened with amino compounds (primary, secondary, or tertiary) such as dicy, substituted ureas, etc. are suitable for use in the present invention.

The second main component of the present adhesive is an additive which has a melting point or temperature $T_M$ selected to cause the adhesive mixture to retain strong adhesive bonding up to a desired temperature range of between approximately 100° C. to 150° C., and then soften sufficiently to enable die removal. Although any additive which will produce the desired effect may be utilized within the scope of the invention, preferred additives include thermoplastic epoxy resins and other thermoplastic materials having melting points higher than approximately 150° C. Examples of applicable thermoplastic resins include polysulfones, polyetherimides, block copolymers of chlorotrifluoroethylene with vinylidene fluoride, polycarbonates, polyamides, polyethyleneterephtalate, polyphenylene sulfides, fluorinated polymers, and bismaleimides.

The thermoplastic material may constitute 1% to 50% by weight of the adhesive, typically 10% to 30%. Examples of thermoplastic resins which may be utilized in the lower range of 1% to 10% include polyphenylene sulfide ($T_M=285°$ C. to 290° C.), and crystalline or amorphous insulating compounds such as crystalline polyamide ($T_M=290°$ C.). As will become apparent from subsequent description, the melting point of the thermoplastic material is not necessarily the same as the softening point of the cured adhesive mixture, due to interaction between the thermosetting and thermoplastic components.

In addition to the thermosetting and thermoplastic resins, the present adhesive may include one or more additional additives or fillers to control shrinkage or expansion coefficients, enhance thermal conductivity, or render the adhesive electrically conductive. Examples of such fillers include, but are not limited to, aluminum oxide, silicon oxide, silicon dioxide, silicon nitride, titanium oxide, aluminum nitride, diamond, lithofrax, calcium carbonate, or other carbonates.

The principles of the present invention will become better understood from the following example, with reference being made to the Figure of drawing.

EXAMPLE

A liquid thermoplastic material was blended in quantities of 10, 20, 30 and 50% by weight with a non-conductive die-attach epoxy to evaluate its effect on die shear strengths. Silicon dies were mounted, cured, and shear tested at room temperature, 100, 150 and 200° C., using the adhesive mixtures in addition to the pure epoxy and pure thermoplastic materials. It was found that at 100° C. and below, there was little degradation in the measured shear strength of the thermoplastic mixtures compared with the pure epoxy. However, at 150° C., the shear force required for die removal was significantly less (50%) with the epoxy/thermoplastic mixtures than with the conventional die-attach epoxy.

The thermosetting epoxy resin was an electrically nonconductive material designated as Ablebond 84-1, supplied by Ablestik Laboratories. The thermoplastic material was a thermoplastic epoxy resin designated as SM-933-60, supplied by Emerson & Cuming, Inc.

The thermosetting and thermoplastic materials were mixed by hand in the above described ratios, and outgassed prior to die attach. The dies were 0.08 inch square, and mounted on gold plated alumina substrates. All samples were outgassed again for 5 minutes after die attachment and then cured for one hour at 125° C.

The average shear strength for the samples containing mixtures of thermoplastic material up to 50% showed a reduced amount of force in comparison to the pure epoxy adhesive required to remove the dies from the substrate at temperatures of 150° C. to 175° C.

At 100° C. and below, the thermoplastic material appeared to have little effect on the measured shear strength of the epoxy. The pure thermoplastic material had very poor shear strength between 25° C. and 100° C. No tests at higher temperatures were performed.

The conclusions of the tests are as follows.

1. The addition of the thermoplastic material to the epoxy material lowered the shear force required for die removal at 150° C. and at 175° C. by at least 50%.

2. At and below 100° C. the addition of the thermoplastic material appeared to have no effect on the measured shear strength of the adhesive.

The thermosetting epoxy resin without any additives retained a shear strength of approximately 2000 psi up to a temperature of about 155° C., above which the shear strength decreased to a value of about 1000 psi at 175° C. The pure thermoplastic material had an initial shear strength of about 1250 psi, which dropped below 500 psi as the temperature approached 100° C.

The shear strength of the 50% mixture began to deviate from that of the pure epoxy material at approximately 100° C., and decreased to a value of about 1000 psi at 150° C. The shear strength further decreased by 67% as the temperature was increased to 175° C.

Ideally, the adhesive would retain full strength up to a value of approximately 155° C., and drop sharply to a very low level as the temperature is increased further.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A reworkable electronic component structure, comprising:
    a substrate;
    an electronic circuit component; and
    an adhesive for reworkably adhering the component to the substrate, the adhesive including:
        a curable thermosetting resin; and
        an additive selected to cause the adhesive, in its cured state, to soften at a temperature between approximately 100° C. and 250° C.

2. A structure as in claim 1, in which the additive is selected to cause the adhesive to soften at a temperature between approximately 150° C. and 200° C.

3. A structure as in claim 2, in which the additive has a melting temperature above approximately 150° C.

4. A structure as in claim 3, in which the thermosetting resin has a glass transition temperature above approximately 200° C.

5. A structure as in claim 1, in which the thermosetting resin comprises an epoxy resin.

6. A structure as in claim 5, in which the epoxy resin comprises diglycidyl ether of bisphenol A.

7. A structure as in claim 5, in which the additive constitutes between approximately 1% and 50% by weight of the adhesive.

8. A structure as in claim 5, in which the additive constitutes between approximately 10% and 30% by weight of the adhesive.

9. A structure as in claim 5, in which the additive comprises a thermoplastic resin.

10. A structure as in claim 9, in which the thermoplastic resin comprises a thermoplastic epoxy resin.

11. A structure as in claim 1, in which the component is an integrated circuit die.

12. A structure as in claim 1, in which the adhesive further comprises a filler material.

13. A reworkable electronic die-attach adhesive comprising:
    a curable thermosetting resin; and
    an additive selected to cause the adhesive, in its cured state, to soften at a temperature between approximately 100° C. and 250° C.

14. An adhesive as in claim 13, in which the additive is selected to cause the adhesive to soften at a temperature between approximately 150° C. and 200° C.

15. An adhesive as in claim 14, in which the additive has a melting temperature above approximately 150° C.

16. An adhesive as in claim 15, in which the thermosetting resin has a glass transition temperature above approximately 200° C.

17. An adhesive as in claim 13, in which the thermosetting resin comprises an epoxy resin.

18. An adhesive as in claim 17, in which the epoxy resin comprises diglycidyl ether of bisphenol A.

19. An adhesive as in claim 17, in which the additive constitutes between approximately 1% and 50% by weight of the adhesive.

20. An adhesive as in claim 17, in which the additive constitutes between approximately 10% and 30% by weight of the adhesive.

21. An adhesive as in claim 17, in which the additive comprises a thermoplastic resin.

22. An adhesive as in claim 21, in which the thermoplastic resin comprises a thermoplastic epoxy resin.

23. An adhesive as in claim 13, further comprising a filler material.

* * * * *